(12) United States Patent
Tamura

(10) Patent No.: US 10,804,928 B1
(45) Date of Patent: Oct. 13, 2020

(54) DA CONVERSION DEVICE

(71) Applicant: Asahi Kasei Microdevices Corporation, Tokyo (JP)

(72) Inventor: Naoto Tamura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/843,894

(22) Filed: Apr. 9, 2020

(30) Foreign Application Priority Data

Apr. 11, 2019 (JP) .................. 2019-075776

(51) Int. Cl.
| | |
|---|---|
| *H03M 1/66* | (2006.01) |
| *H03M 3/00* | (2006.01) |
| *H03M 1/12* | (2006.01) |
| *H03M 1/80* | (2006.01) |
| *H03M 1/00* | (2006.01) |

(52) U.S. Cl.
CPC ............. *H03M 3/50* (2013.01); *H03M 3/32* (2013.01); *H03M 3/358* (2013.01); *H03M 1/00* (2013.01); *H03M 1/12* (2013.01); *H03M 1/66* (2013.01); *H03M 1/804* (2013.01)

(58) Field of Classification Search
CPC .......... H03M 1/66; H03M 1/00; H03M 1/804; H03M 1/12
USPC ................. 341/144, 150, 172, 126
See application file for complete search history.

(56) References Cited

U.S. PATENT DOCUMENTS

| | | | |
|---|---|---|---|
| 5,172,019 A | 12/1992 | Naylor et al. | |
| 5,990,819 A | 11/1999 | Fujimori | |
| 2008/0297390 A1* | 12/2008 | Ko ................ | H03M 1/664 341/144 |

FOREIGN PATENT DOCUMENTS

| | | |
|---|---|---|
| JP | H0613901 | 4/1994 |
| JP | H1155121 | 2/1999 |
| JP | 2013198064 | 9/2013 |

* cited by examiner

*Primary Examiner* — Joseph J Lauture
(74) *Attorney, Agent, or Firm* — JCIPRNET

(57) ABSTRACT

A DA conversion device includes a level determiner determining whether a level of the digital signal or the analog signal is higher than a predetermined threshold value; a DA converter including plural capacitors, an operational amplifier which generates the analog signal, and a plurality of transistors which connects each of the plural capacitors to a first or a second reference voltage according to the digital signal in a first connection state and connects the plural capacitors between an input terminal and an output terminal of the operational amplifier in a second connection state; and a setting part which receives a clock signal and sets gate-source voltages of the plurality of transistors such that the plurality of transistors is in the first connection state in a first period of the clock signal and the plurality of transistors is in the second connection state in a second period of the clock signal.

6 Claims, 16 Drawing Sheets

US 10,804,928 B1

DA CONVERSION DEVICE

CROSS REFERENCE TO RELATED APPLICATIONS

This application claims the priority benefit of Japanese Patent Application No. 2019-075776, filed on Apr. 11, 2019. The entirety of the above-mentioned patent application is hereby incorporated by reference herein and made a part of this specification.

BACKGROUND

Technical Field

The disclosure relates to a DA conversion device.

Description of Related Art

FIG. 1 shows a DA conversion device 10 in the prior art (Japanese Patent Laid-Open No. H11-55121). The DA conversion device 10 includes an interpolation filter 11, a delta-sigma modulator 12, a dynamic element matching (DEM) 13, and a DA converter 14. The interpolation filter 11 converts an input signal that is a digital sampled at a predetermined sampling frequency into a digital signal at a higher frequency than the sampling frequency. The delta-sigma modulator 12 shapes a form of a noise power spectrum density distribution of the digital signal output from the interpolation filter 11 to reduce the noise power of a low frequency band that is a signal band. The DEM 13 randomizes the digital signal. Randomization of the digital signal improves linearity due to variation in manufacture of a passive element that converts the digital signal to an analog signal. The DA converter 14 converts an input signal that is a digital signal into an output signal that is an analog signal and outputs the output signal. Specifically, the DA converter 14 converts the digital signal output from the DEM 13 into an analog voltage signal and outputs the analog voltage signal.

A circuit configuration of the DA converter 14 is shown in FIG. 2. Meanwhile, although the circuit shown in FIG. 2 has a single-end configuration, a full differential configuration is also possible. The DA converter 14 includes an operational amplifier 15, a plurality of capacitors C1, C2 . . . Ci, switches that switch connection states of the plurality of capacitors C1, C2 . . . Ci, and a controller that controls gate voltages of transistors included in the switches. Here, the switches include switches SUP1, SUP2 . . . SUPi, SUN1, SUN2 . . . SUNi, SY1, SY2 . . . SYi, SUG1, SUB2 . . . SUGi, SB, and SU of FIG. 2. In addition, the controllers include a clock generation circuit 16 and clock buffers 17 and 18.

Specifically, in FIG. 2, Vr+ is a positive reference voltage (first reference voltage), Vr− is a negative reference voltage (second reference voltage), AGND is an analog reference voltage, Vout is an output voltage of the operational amplifier 15 (i.e., an output voltage of the DA converter 14), C1, C2 . . . Ci are capacitors that sample input digital data, Cfb is a capacitor that filters noise, and D1, D2 . . . Di are digital signals input to the DA converter 14. The switches SUP1, SUP2 . . . SUPi, SUN1, SUN2 . . . SUNi, SY1, SY2 . . . SYi, SUG1, SUB2 . . . SUGi, SB, and SU of FIG. 2 are configured as MOS transistors. $\Phi 1p$, $\Phi 1n$, $\Phi 2p$ and $\Phi 2n$ used to drive the switches are generated based on a reference clock CLK through the clock generation circuit 16 and the clock buffers 17 and 18. Switches SUP1, SUP2 . . . SUPi connected to Vr+ are configured as P-channel transistors and switches SUN1, SUN2 . . . SUNi connected to Vr− are configured as N-channel transistors. SY1, SY2 . . . SYi are assumed to be complementary switches composed of P-channel transistors and N-channel transistors, $\Phi 2p$ is supplied to P-channel transistors, and $\Phi 2n$ is supplied to N-channel transistors. $\Phi 1p$ is supplied to P-channel transistors that are switches connected to Vr+ and $\Phi 1n$ is supplied to N-channel transistors that are switches connected to Vr−. SU and SB are configured as N-channel transistors and $\Phi 1n$ and $\Phi 2n$ are respectively supplied thereto. The generated $\Phi 1p$, $\Phi 1n$, $\Phi 2p$ and $\Phi 2n$ are transient waveforms shown in FIG. 3. The voltage VDD shown in FIG. 3 is a power supply voltage of the DA conversion device 10 and the voltage VSS is a ground voltage of the DA conversion device 10. FIG. 4 shows the clock buffer 18 that generates $\Phi 2p$ and $\Phi 2n$. Since a power supply voltage of the clock buffer 18 is the voltage VDD and a ground voltage thereof is the voltage VSS, the voltage VDD is provided as a high voltage of $\Phi 2p$ and $\Phi 2n$ and the voltage VSS is provided as a low voltage thereof. Similarly, since a power supply voltage of the clock buffer 17 that generates $\Phi 1p$ and $\Phi 1n$ is VDD and a ground voltage thereof is the voltage VSS, the voltage VDD is provided as a high voltage of $\Phi 1p$ and $\Phi 1n$ and the voltage VSS is provided as a low voltage thereof.

The operation of the DA converter 14 will be described below. The DA converter 14 has a sampling phase (first period) in which charge is charged into C1, C2 . . . Ci according to an input digital signal and a transfer phase (second period) in which charges of C1, C2 . . . Ci charged in the sampling phase are transferred to Cfb. The sampling phase and the transfer phase are alternatively generated. The controller controls the switches such that the plurality of capacitors C1, C2 . . . Ci are connected to the first reference voltage Vr+ or the second reference voltage Vr− according to input digital signals D1, D2 . . . Di. Specifically, when the input digital signal Di is a high voltage, the capacitor Ci is connected to the first reference voltage Vr+ and the analog reference voltage AGND and positive charge is charged thereinto in the sampling phase. When the input digital signal Di is a low voltage, the capacitor Ci is connected to the second reference voltage Vr− and analog reference voltage AGND and negative charge is charged thereinto. Meanwhile, the controller controls the switches such that the capacitors C1, C2 . . . Ci are connected between the input terminal and the output terminal of the operational amplifier 15 in the transfer phase. Here, the capacitors C1, C2 . . . Ci are connected in parallel between the input terminal and the output terminal of the operational amplifier 15, for example, as shown in FIG. 2. Accordingly, positive charges and negative charges accumulated in the capacitors C1, C2 . . . Ci in the sampling phase are summed in the transfer phase, transferred to Cfb and output as a voltage at the output of the DA converter 14. That is, the output voltage of the DA converter 14 increases in proportion to the number of high voltages of the input digital signals D1, D2, . . . Di.

When the output signal Vout of the DA converter 14 is high, generation of significant distortion at the output of the DA converter 14 is conceivable. Since the transistor switches SY1, SY2 . . . SYi of FIG. 2 are connected to the output signal Vout, the gate-source voltages of the transistor switches SY1, SY2 . . . SYi are voltages depending on the output signal and resistance values thereof have signal dependency to cause generation of distortion in the output signal. To decrease signal dependency of a resistance value of a transistor, in general, it is necessary to apply a high voltage as a gate voltage in the case of an N-channel transistor and apply a low voltage as a gate voltage in the case of a P-channel transistor. However, a circuit for generating the aforementioned high voltage and low voltage is required and power consumption increase of the circuit causes increase of power consumption of the device.

SUMMARY

The disclosure provides a DA conversion device which suppress the increase in power consumption while improving distortion characteristics.

In one embodiment, the disclosure provides a DA conversion device which converts a digital signal into an analog signal. The DA conversion device includes: a level determiner which determines whether a level of the digital signal or the analog signal is higher than a predetermined threshold value; a DA converter including a plurality of capacitors, an operational amplifier which generates the analog signal, and a plurality of transistors which connects the plurality of capacitors to a first reference voltage or a second reference voltage according to the digital signal in a first connection state and connects the plurality of capacitors between an input terminal and an output terminal of the operational amplifier in a second connection state; and a setting part which receives a clock signal and sets gate-source voltages of the plurality of transistors such that the plurality of transistors is in the first connection state in a first period of the clock signal and the plurality of transistors is in the second connection state in a second period of the clock signal. The setting part sets absolute values of gate-source voltages of at least a portion of the plurality of transistors to be lower than absolute values of the gate-source voltages of a case in which the level determiner determines that the level is higher than the threshold value when the level determiner determines that the level is lower than the threshold value.

DESCRIPTION OF THE EMBODIMENTS

Embodiment 1

(Configuration)

Figure 5:
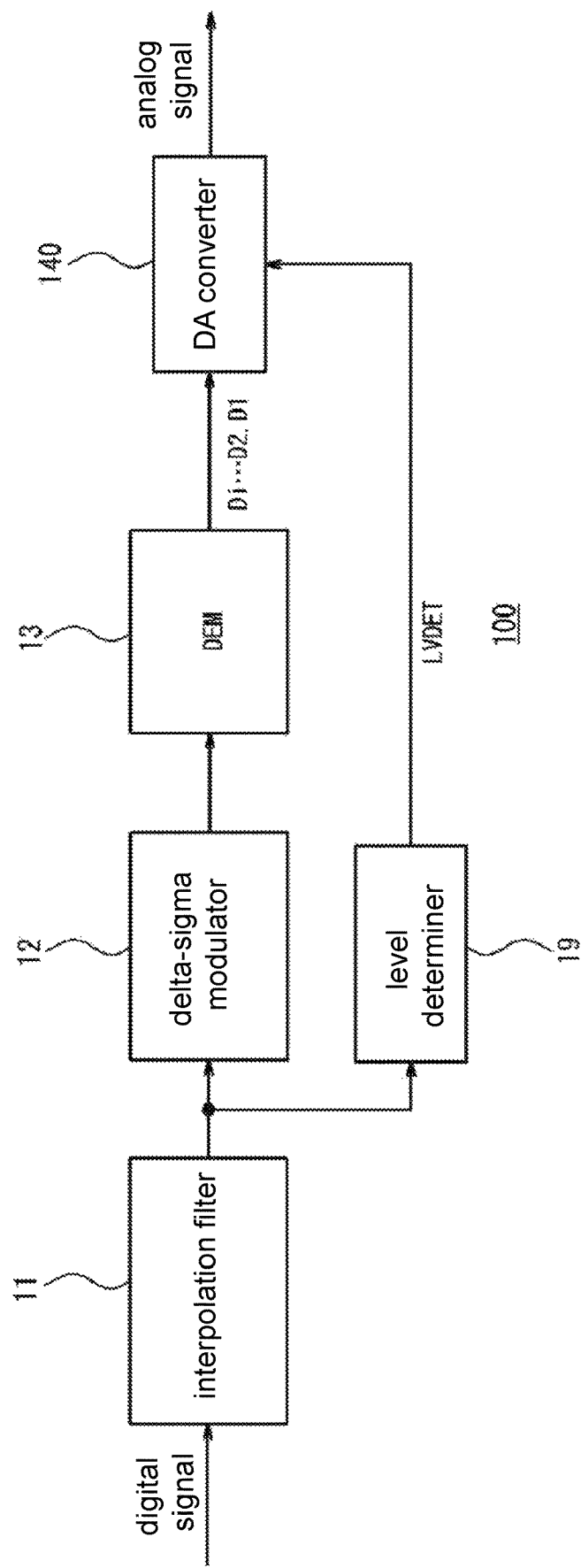
FIG. 5 shows a DA conversion device of the disclosure.

FIG. 5 shows a DA conversion device 100 of the embodiment 1. The interpolation filter 11, the delta-sigma modulator 12, and the DEM 13 are the same as those of the related art. The DA conversion device 100 differs from the DA conversion device 10 according to the above-described related art in that details of a DA converter 140 are different from those of the related art and a level determiner 19 is added. The DA conversion device 100 converts a digital signal into an analog signal and includes the level determiner 19, the DA converter 140, and a setting part. Here, as an example, the setting part may include a clock generation circuit 16, a clock buffer 17 and a clock buffer 180 as shown in FIG. 8.

Figure 6:
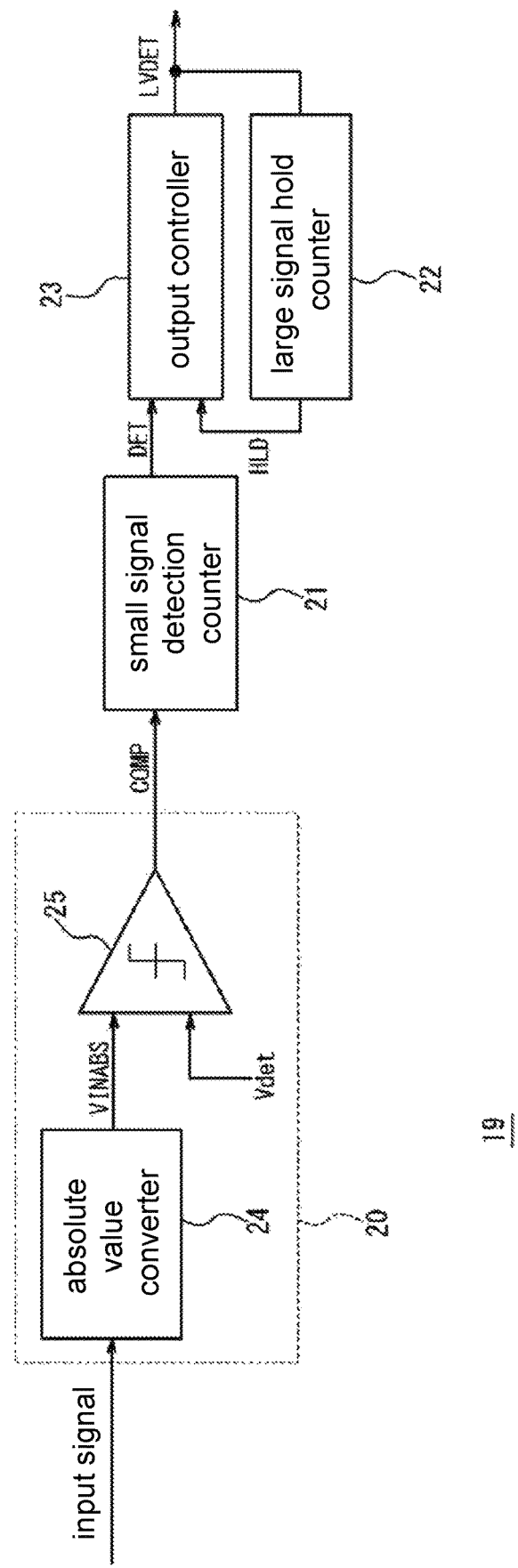
FIG. 6 shows a level determiner of the disclosure.

FIG. 6 shows a configuration diagram of the added level determiner 19. The level determiner 19 includes a level comparator 20 which generates a detection signal in response to a magnitude of an input signal, a small signal detection counter 21 which counts a duration of a low voltage of an output signal COMP of the level comparator 20, a large signal hold counter 22 which counts a duration for which a high voltage of a control signal LVDET for power down of a part of the DA converter 140 is held, and an output controller 23 which controls a voltage of the control signal LVDET from output signals of the two counters. The level comparator 20 includes an absolute value converter 24 which converts an input signal into an absolute value, and a comparator 25 which compares the input signal converted into the absolute value thereof with a predetermined threshold value Vdet. In addition, the level determiner 19 determines whether the level of a digital signal or an analog signal is higher than the predetermined threshold value Vdet.

Figure 7:
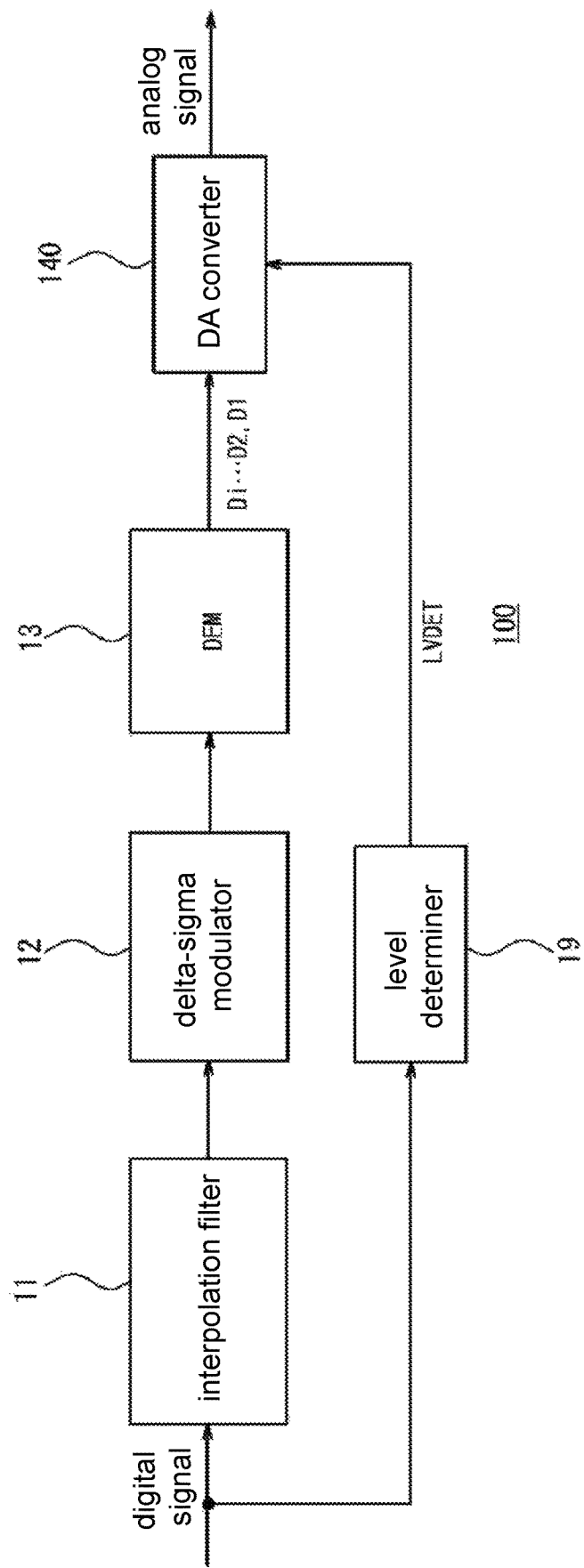
FIG. 7 shows a DA conversion device of the disclosure.

The level determiner 19 generates the control signal LVDET in response to the magnitude of a signal in the DA conversion device 100 and inputs the control signal LVDET to the DA converter 140. Specifically, the level determiner 19 switches between a high voltage and a low voltage of the control signal LVDET based on the magnitude of the signal in the DA conversion device 100. Meanwhile, although the control signal LVDET is generated based on the magnitude of an output signal of the interpolation filter 11 in FIG. 5, the magnitude of any signal in the DA conversion device 100 can be determined as long as a signal magnitude can be determined in conversion of the output signal of the DA converter 140. In other words, the level determiner 19 may generate the control signal LVDET based on the magnitude of any signal in the DA conversion device 100 if the signal has a correlation with the output signal of the DA converter 140. As an example, an input signal of the interpolation filter 11 may be provided to the level determiner 19, as shown FIG. 7. Hereinafter, a corresponding signal in the DA conversion device 100 used to generate the control signal LVDET is also called an "object signal."

Figure 8:
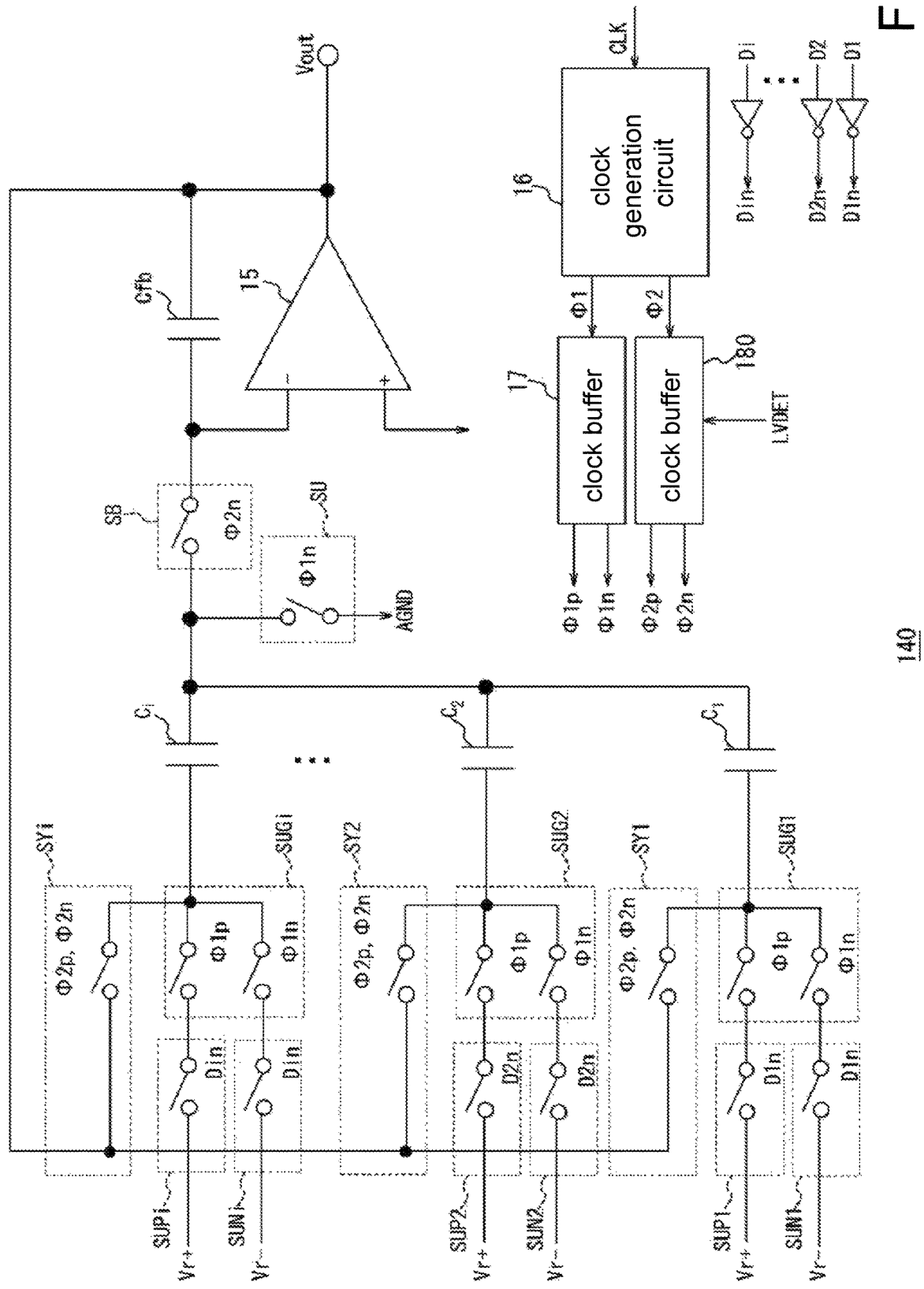
FIG. 8 shows a configuration example of a DA converter of the embodiment 1.
Figure 9:
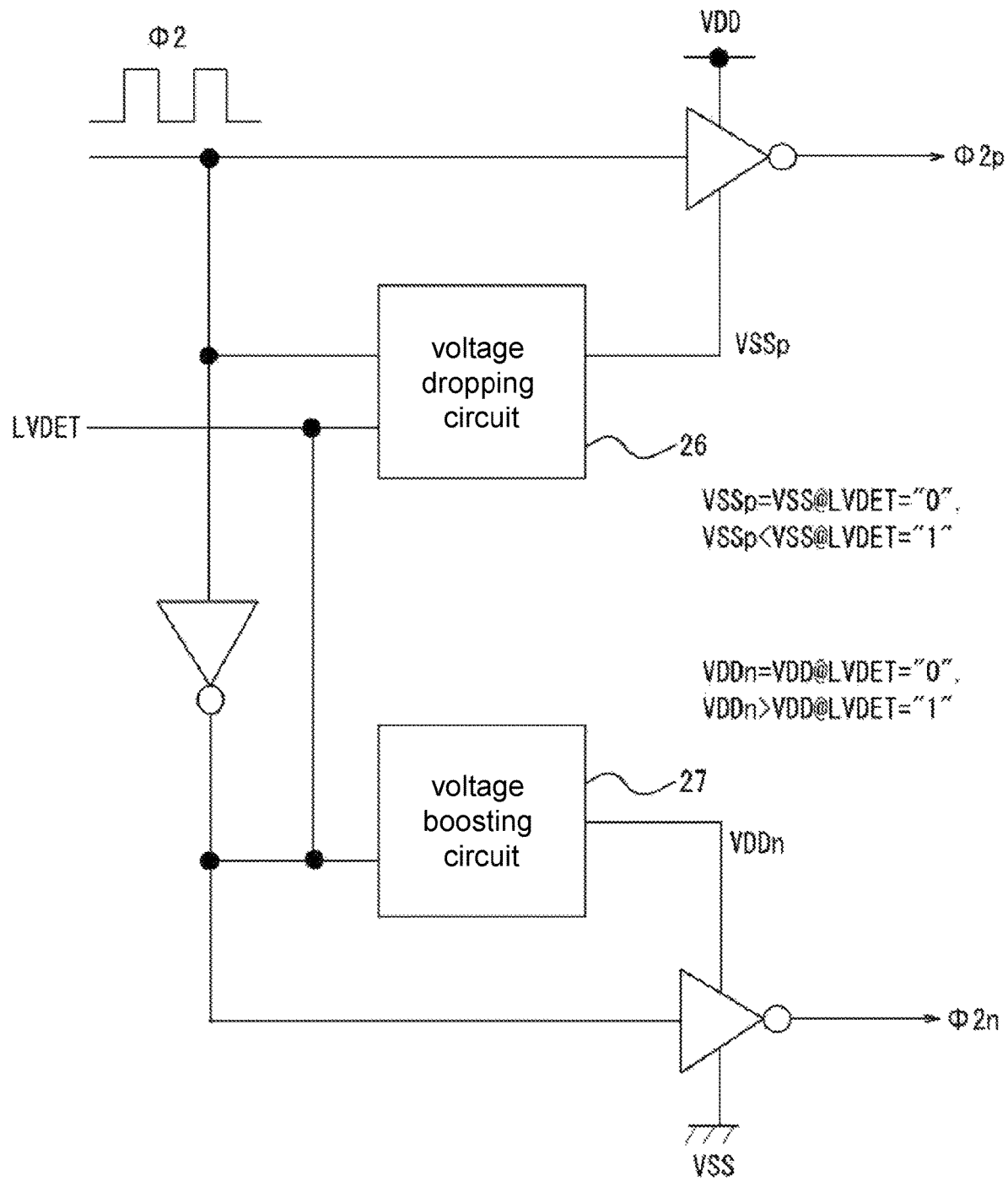
FIG. 9 shows a configuration example of a clock buffer of the DA converter of the embodiment 1.

A configuration example of the DA converter 140 in the embodiment 1 is shown in FIG. 8. Although the circuit shown in FIG. 8 has a single-end configuration, a full differential configuration is also possible. FIG. 9 shows a clock buffer 180 included in the DA converter 140. As compared to the clock buffer 18 according to the related art, a voltage dropping circuit 26 and a voltage boosting circuit 27 for power supply and the control signal LVDET thereof are added to the clock buffer 180.

As shown in FIG. 8, the DA converter 140 includes a plurality of capacitors C1, C2, ..., Ci, an operational amplifier 15 which generates an analog signal Vout, and a plurality of transistors SY1, SY2, ..., SYi. The plurality of transistors SY1, SY2, ..., SYi respectively connects the plurality of capacitors C1, C2, ..., Ci to the first reference voltage Vr+ or the second reference voltage Vr− in response to a digital signal in a first connection state, and respectively connects the plurality of capacitors C1, C2, ..., Ci between an input terminal and an output terminal of the operational amplifier 15 in a second connection state.

The setting part, which includes a clock generation circuit 16, a clock buffer 17 and a clock buffer 180, receives a clock signal CLK and sets gate-source voltages of the plurality of transistors SY1, SY2, ..., SYi such that the plurality of transistors SY1, SY2, ..., SYi is in the first connection state in a first period (sampling phase) of the clock signal CLK. In addition, the setting part sets the gate-source voltages of the plurality of transistors SY1, SY2, ..., SYi such that the plurality of transistors SY1, SY2, ..., SYi is in the second connection state in a second period (transfer phase) of the clock signal CLK.

In addition, when the level determiner 19 determines that the level of the aforementioned digital signal or analog signal is lower than the predetermined threshold value Vdet, the setting part sets the absolute values of the gate-source voltages of at least a portion of the plurality of transistors SY1, SY2, ..., SYi to be low as compared to a case in which the level determiner 19 determines that the level is higher than the predetermined threshold value Vdet.

(Operation)

An operation of the level determiner 19 to generate the control signal LVDET will be described. As described above, the level determiner 19 switches between the high voltage (e.g., "1") and the low voltage (e.g., "0") of the control signal LVDET based on the magnitude of the signal in the DA conversion device 100. The level determiner 19 determines whether the level of a signal having a correlation with the output signal of the DA converter 140 is higher than the predetermined threshold value Vdet.

In the embodiment 1, the level determiner 19 switches the control signal LVDET from the low voltage to the high voltage when the magnitude of the object signal in the DA conversion device 100 exceeds the predetermined threshold value (reference value) Vdet. In addition, the level determiner 19 switches the control signal LVDET from the high voltage to the low voltage according to which is later between when a first reference time Thold has elapsed from when the magnitude of the object signal in the DA conversion device 100 exceeds the predetermined threshold value Vdet and when a state in which the magnitude of the object signal is equal to or less than the predetermined threshold value Vdet continues for a second reference time Tdet. Meanwhile, as another embodiment, a configuration in which the high voltage and the low voltage of the control signal LVDET are reversed is also possible.

A specific example will be described with reference to FIG. 10. The control signal LVDET is "0" when the object signal is less than the predetermined threshold value Vdet and "1" when the object signal is equal to or greater than the predetermined threshold value Vdet. When an output signal VINABS of the absolute value converter 24 exceeds the predetermined threshold value Vdet in a state in which the control signal LVDET is "0," the output signal COMP of the level comparator 20 becomes "1." When the signal COMP becomes "1," an signal DET of the small signal detection counter 21 becomes "1." When the signal DET becomes "1," the output controller 23 causes transition of the control signal LVDET from "0" to "1." Upon transition from "0" to "1" of the control signal LVDET, the large signal hold counter 22 starts counting and the holding signal HLD becomes "1." After the large signal hold counter 22 performs counting up to the first reference time Thold, the holding signal HLD becomes "0" because the control signal LVDET is held in the state of "1." Here, the small signal detection counter 21 starts counting when the signal VINABS is less than the predetermined threshold value Vdet, that is, the signal COMP becomes "0," in a state in which the signal DET is "1" and the output controller 23 causes transition of the control signal LVDET to "0" when the state in which the signal COMP is "0" continues for the second reference time Tdet. In addition, the output controller 23 causes transition of the control signal LVDET from "1" to "0" when transition of the holding signal HLD from "1" to "0" occurs in a state in which the signal DET is "0." The first reference time Thold and the second reference time Tdet are provided in order to suppress the frequent switching of the control signal LVDET. Meanwhile, values of predetermined threshold value Vdet, the first reference time Thold and the second reference time Tdet are parameters that can be controlled from the outside the device. The first reference time Thold is set to be longer than the second reference time Tdet.

Figure 1:
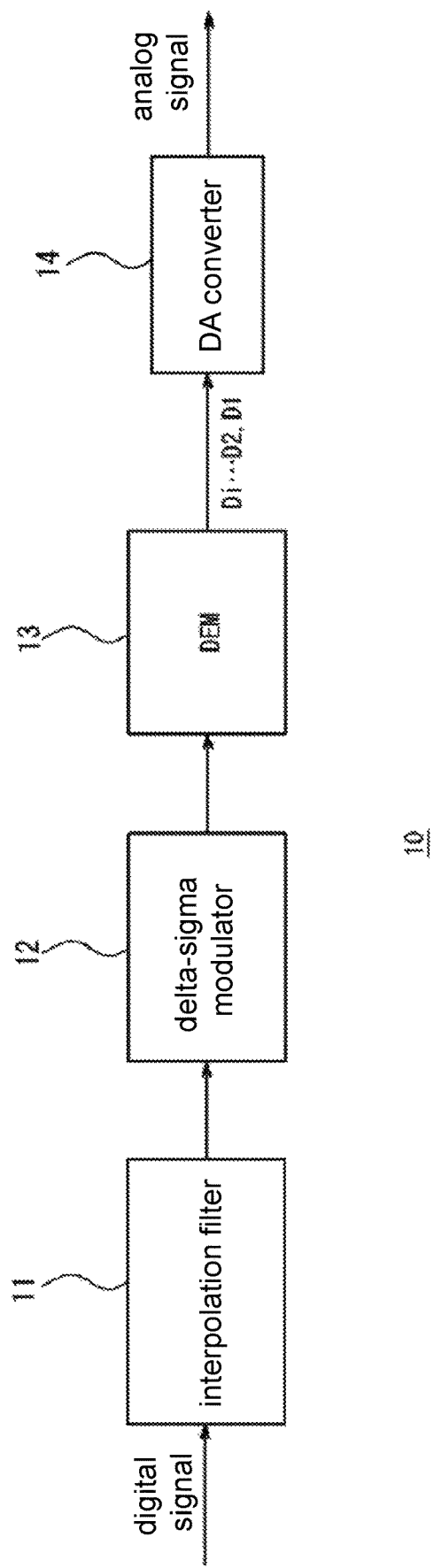
FIG. 1 shows a DA conversion device of the prior art.
Figure 2:
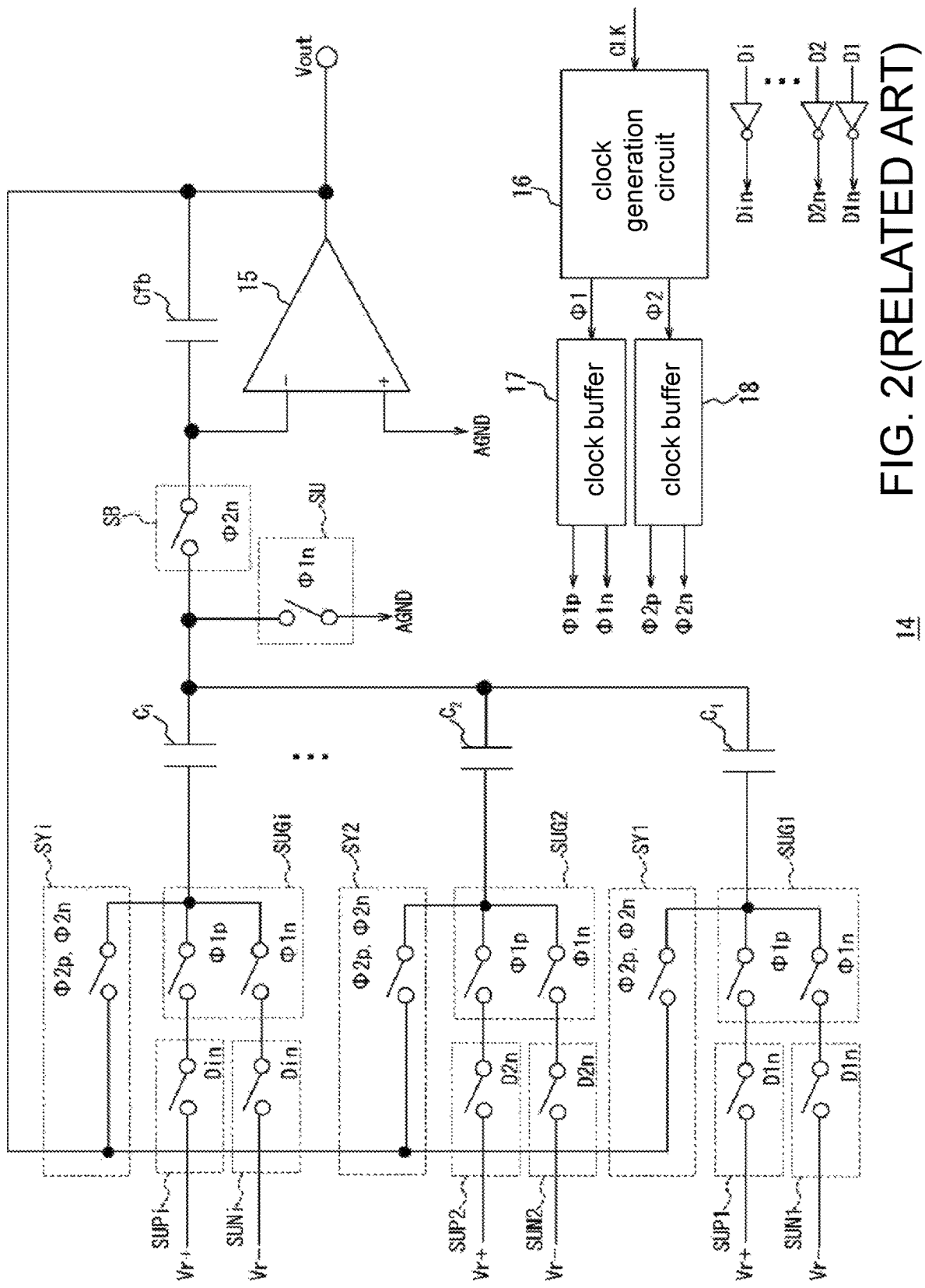
FIG. 2 shows a DA converter of the prior art.
Figure 3:
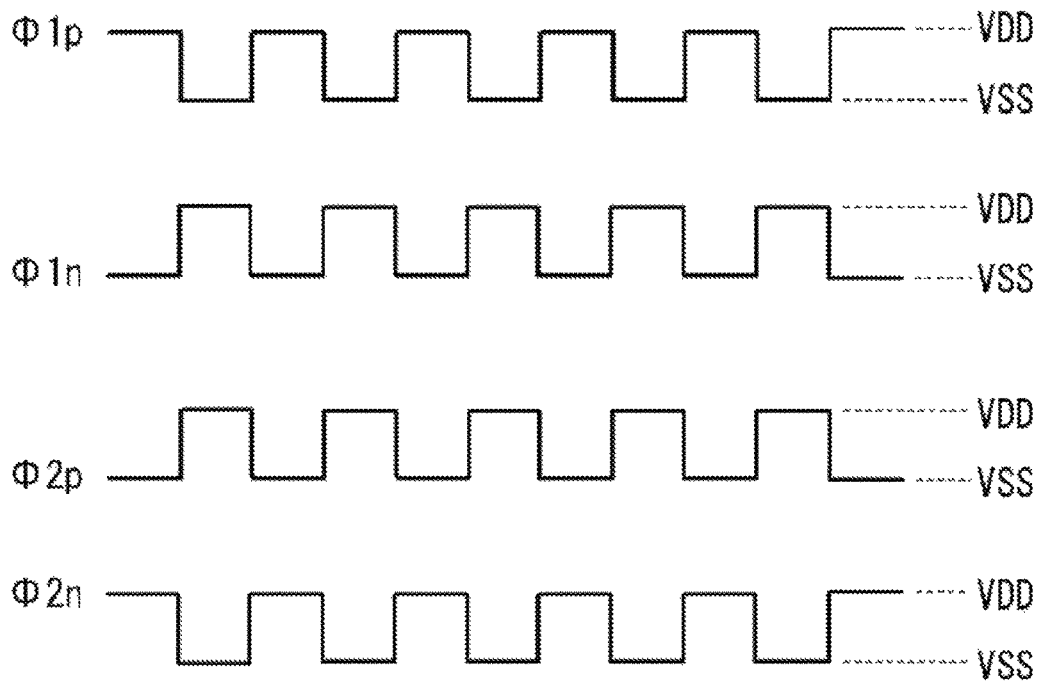
FIG. 3 shows transient waveforms of output voltages of a clock generation circuit of the prior art.
Figure 4:
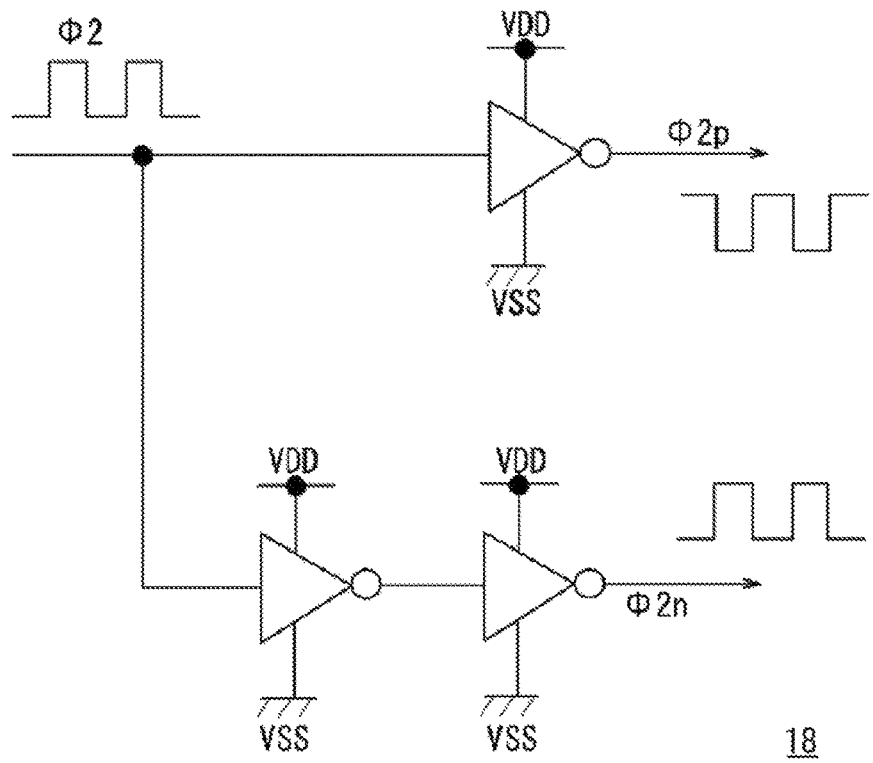
FIG. 4 shows a clock buffer of the DA converter of the prior art.
Figure 11:
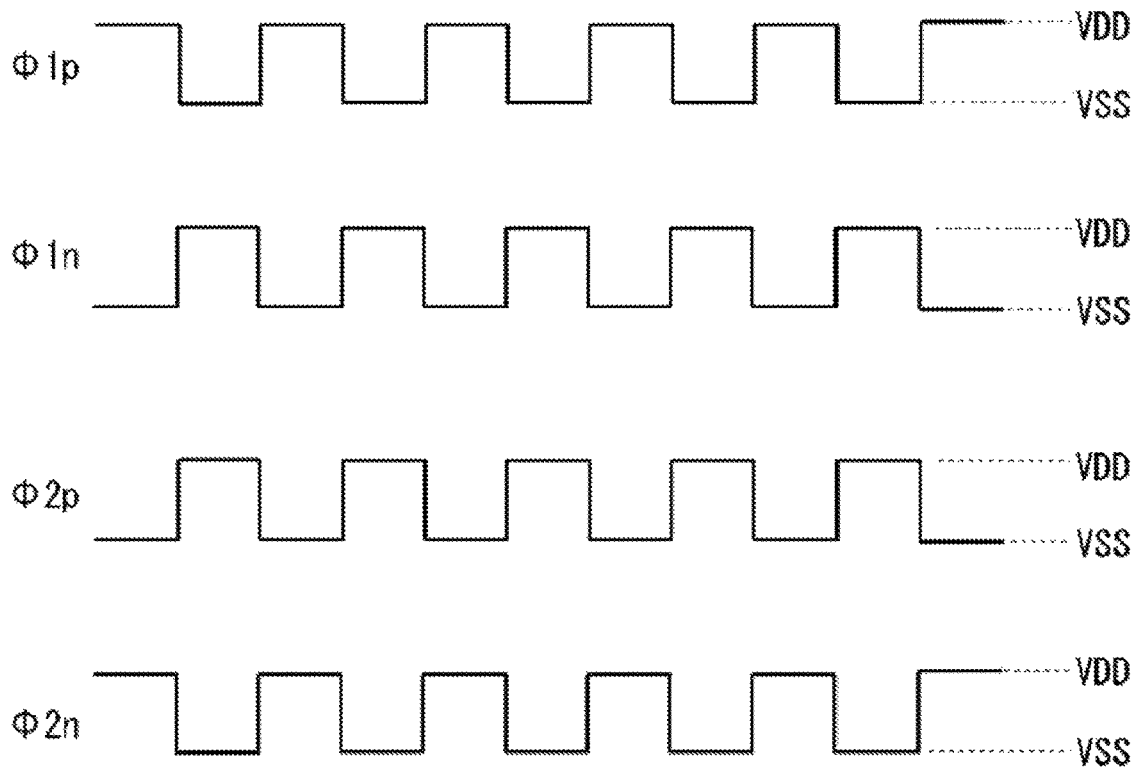
FIG. 11 shows transient waveforms of output voltages of the clock buffer when LVDET="0" in the embodiment 1.
Figure 12:
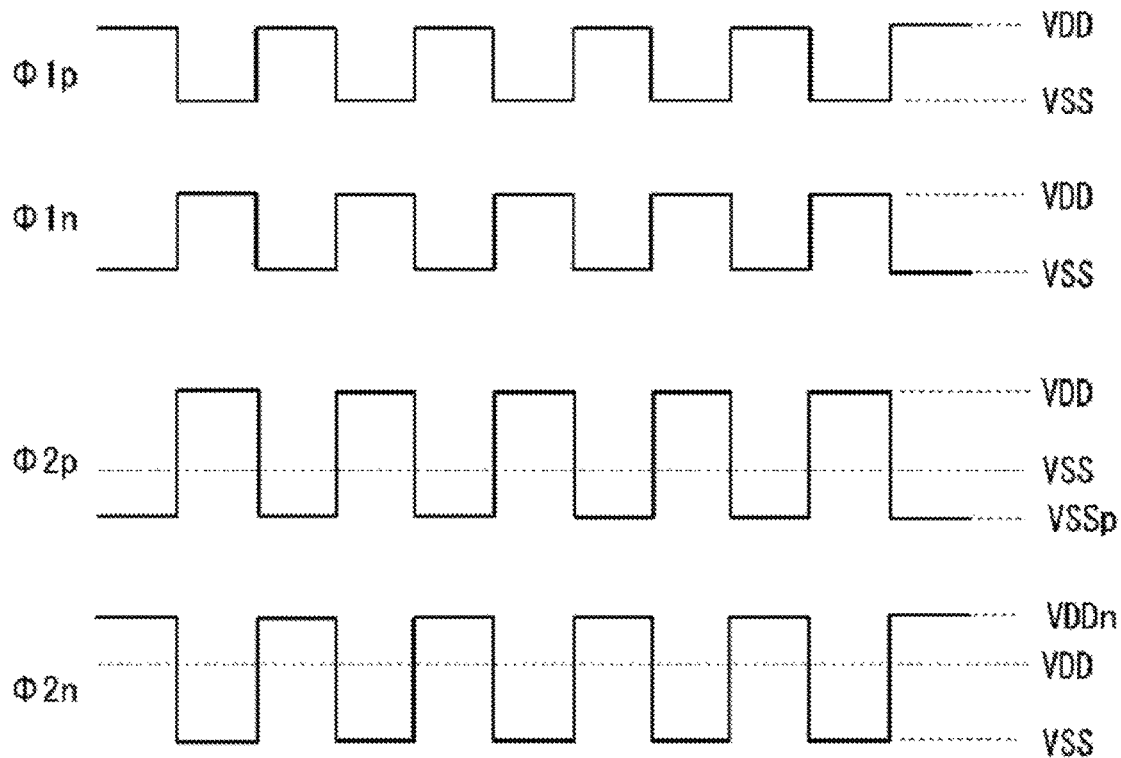
FIG. 12 shows transient waveforms of output voltages of the clock buffer 1 when LVDET="1" in the embodiment 1.

As shown in FIG. 8, when the control signal LVDET input from the level determiner 19 to the DA converter 140 has one (here, "1" is the high voltage) of the high voltage and the low voltage, the setting part increases or decreases the gate voltages of the transistors (here, SY1, SY2, ..., SYi) that connect the plurality of capacitors C1, C2, ..., Ci to the output terminal of the operational amplifier 15 in a transfer phase as compared to a case in which the control signal LVDET has the other one (here, "0" that is the low voltage) of the high voltage and the low voltage. Specifically, the setting part increases the gate voltages of N-channel transistors and decreases the gate voltages of the P-channel transistors. A specific example will be described below. When the control signal LVDET is "0," the clock buffers 17, 180 generates Φ1n, Φ1p, Φ2n and Φ2p as shown in FIG. 11. In this case, outputs of the clock buffers 17, 180 are the same as those of FIG. 3 of the prior art. On the other hand, when the control signal LVDET is "1," Φ2p supplied to the switches of the transistors SY1, SY2, ..., SYi is generated as square waves of a voltage VSSp dropped from VSS and Φ2n is generated as square waves of a voltage VDDn boosted from VDD, as shown in FIG. 12.

In addition, when the level determiner 19 determines that the level of the aforementioned digital signal or analog signal is lower than the predetermined threshold value Vdet, the setting part sets the gate-source voltages of at least a portion of the aforementioned plurality of N-channel transistors to be lower than those when the level determiner 19 determines that the level is higher than the predetermined threshold value Vdet. Further, when the level determiner 19 determines that the level is lower than the predetermined threshold value Vdet, the setting part sets the gate-source voltages of at least a portion of the plurality of P-channel transistors to be higher than those when the level determiner 19 determines that the level is higher than the predetermined threshold value Vdet.

Figure 10:
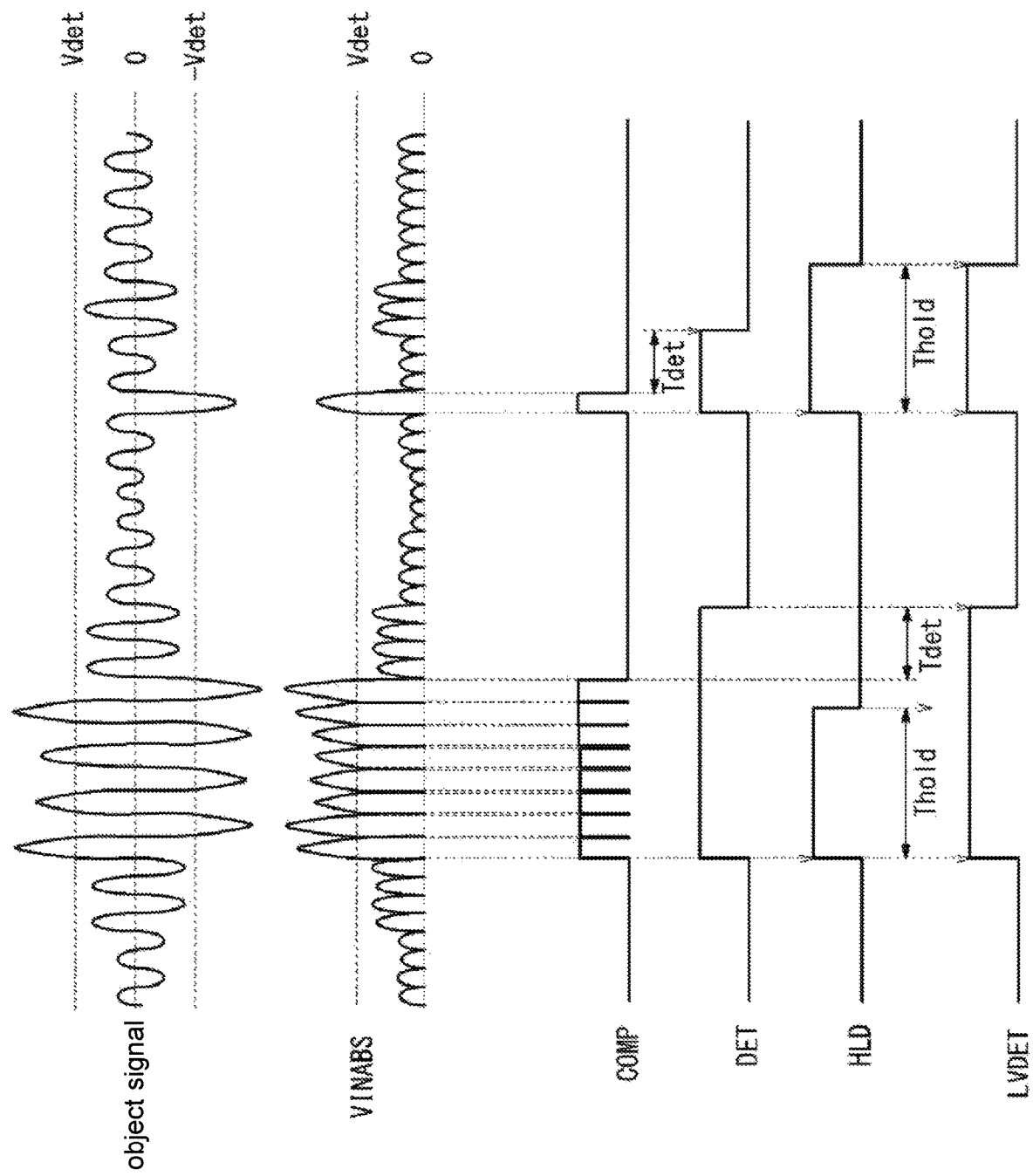
FIG. 10 shows transient waveforms under a condition in which a control signal and LVDET are generated from the level determiner.

Furthermore, as shown in FIG. 10, as an example, the level determiner 19 generates a first control signal HLD that becomes a first logic value "1" of the first period (first reference time) Thold after the level is determined to be higher than the predetermined threshold value Vdet, and generates a second control signal DET that becomes a first logic value "1" of the second period (second reference time) Tdet after the level is determined to be lower than the threshold value Vdet. In a case in which the second control signal DET is transient from the first logic value "1" to a second logic value "0" when the first control signal HLD is the second logic value "0" or a case in which the first control signal HLD is transient from the first logic value "1" to a second logic value "0" when the second control signal DET is the second logic value "0," the setting part sets the absolute values of the gate-source voltages of at least a portion of the plurality of transistors to be lower than those when the level determiner 19 determines that the level is higher than the predetermined threshold value Vdet.

That is, when the output signal Vout is low, the outputs of the clock buffers of the related art, that is, the same output signal as that of the DA converter 14, can be obtained. On the other hand, when the output signal Vout is high, Φ2p is the output of the clock buffer 180 having a low voltage dropped from VSS and Φ2n is the output of the clock buffer 180 having a high voltage boosted from VDD.

The above-described configuration achieves the same power consumption as that of the related art when the output signal Vout is low because the voltage dropping circuit 26 and the voltage boosting circuit 27 of FIG. 9 cause power down (i.e., the voltage dropping circuit 26 and the voltage boosting circuit 27 are not driven when the output signal Vout is low). In addition, since the signal is low, signal dependency of the gate-source voltages of the transistors SY1, SY2, . . . , SYi is low and thus distortion characteristics are less affected.

On the other hand, when the output signal Vout is high, the gate-source voltages of the transistors SY1, SY2, . . . , SYi increase because the voltage dropping circuit 26 and the voltage boosting circuit 27 cause power up (i.e., the voltage dropping circuit 26 and the voltage boosting circuit 27 are driven when Vout is high), and thus signal dependency of resistance values of the transistors SY1, SY2 . . . SYi is reduced and distortion characteristics decrease.

Embodiment 2

(Configuration)

Figure 13:
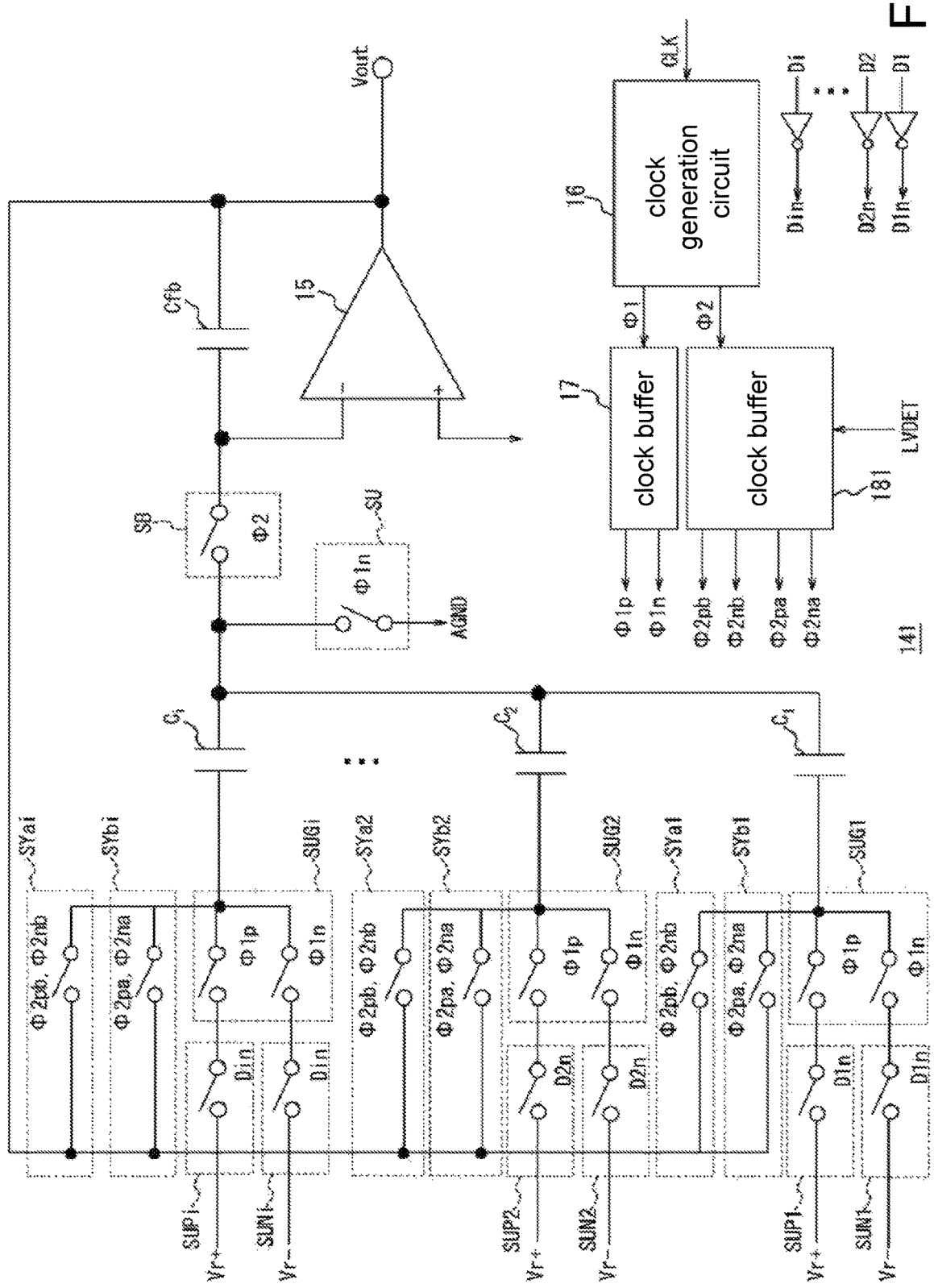
FIG. 13 shows a configuration example of a DA converter of the embodiment 2.
Figure 14:
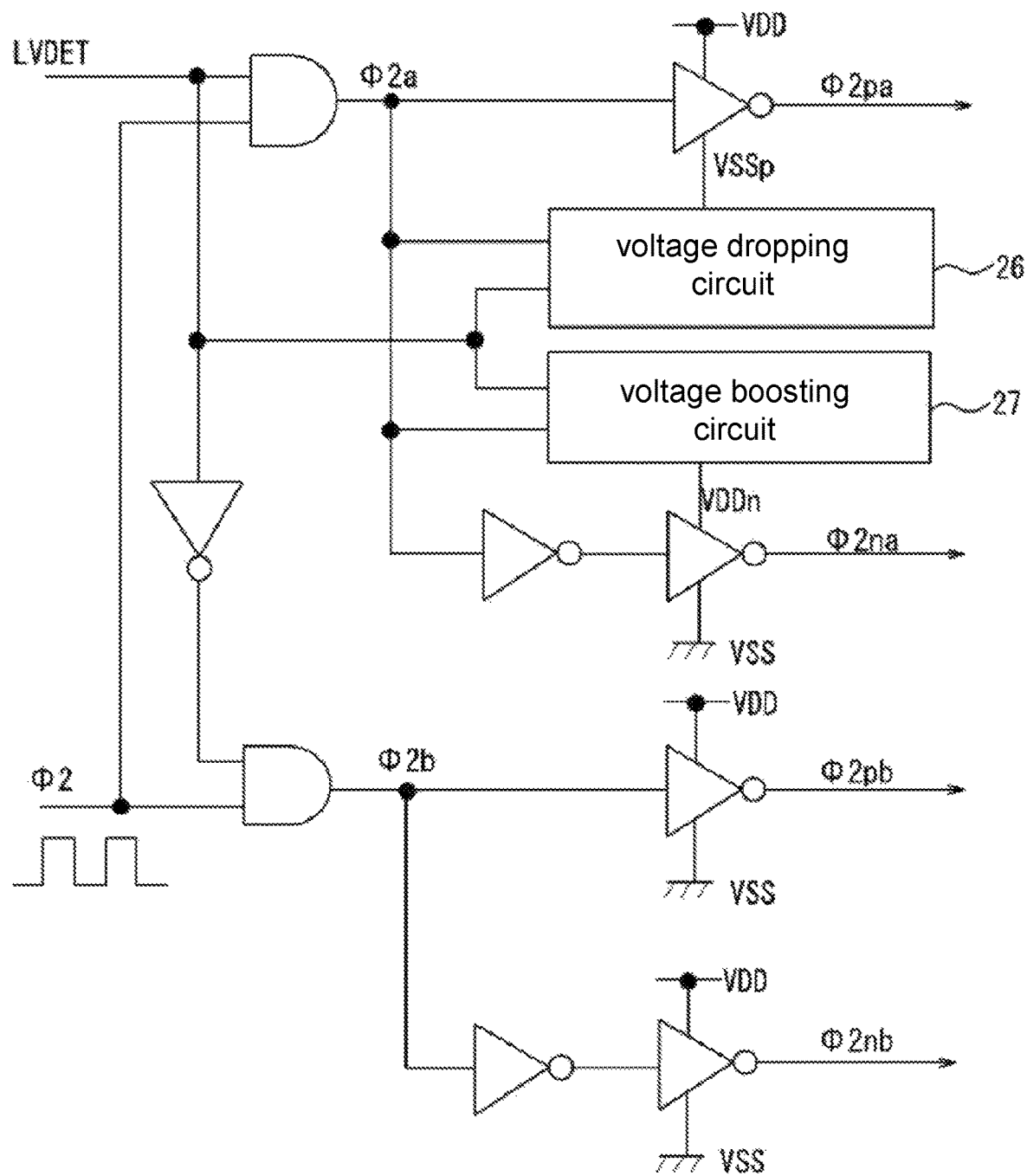
FIG. 14 shows a configuration example of a clock buffer of the DA converter of the embodiment 2.
Figure 15:
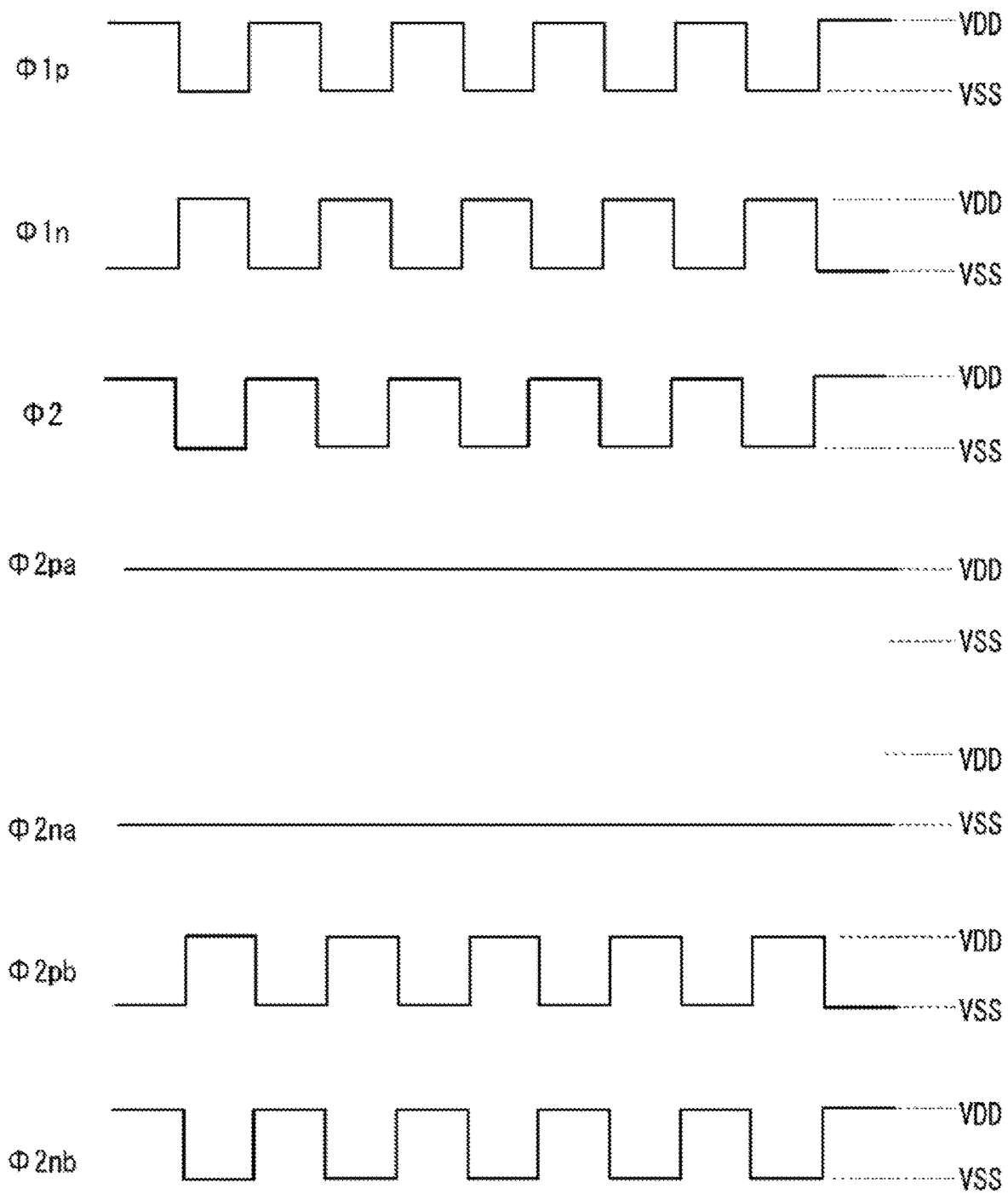
FIG. 15 shows transient waveforms of output voltages of the clock buffer when LVDET="0" in the embodiment 2.
Figure 16:
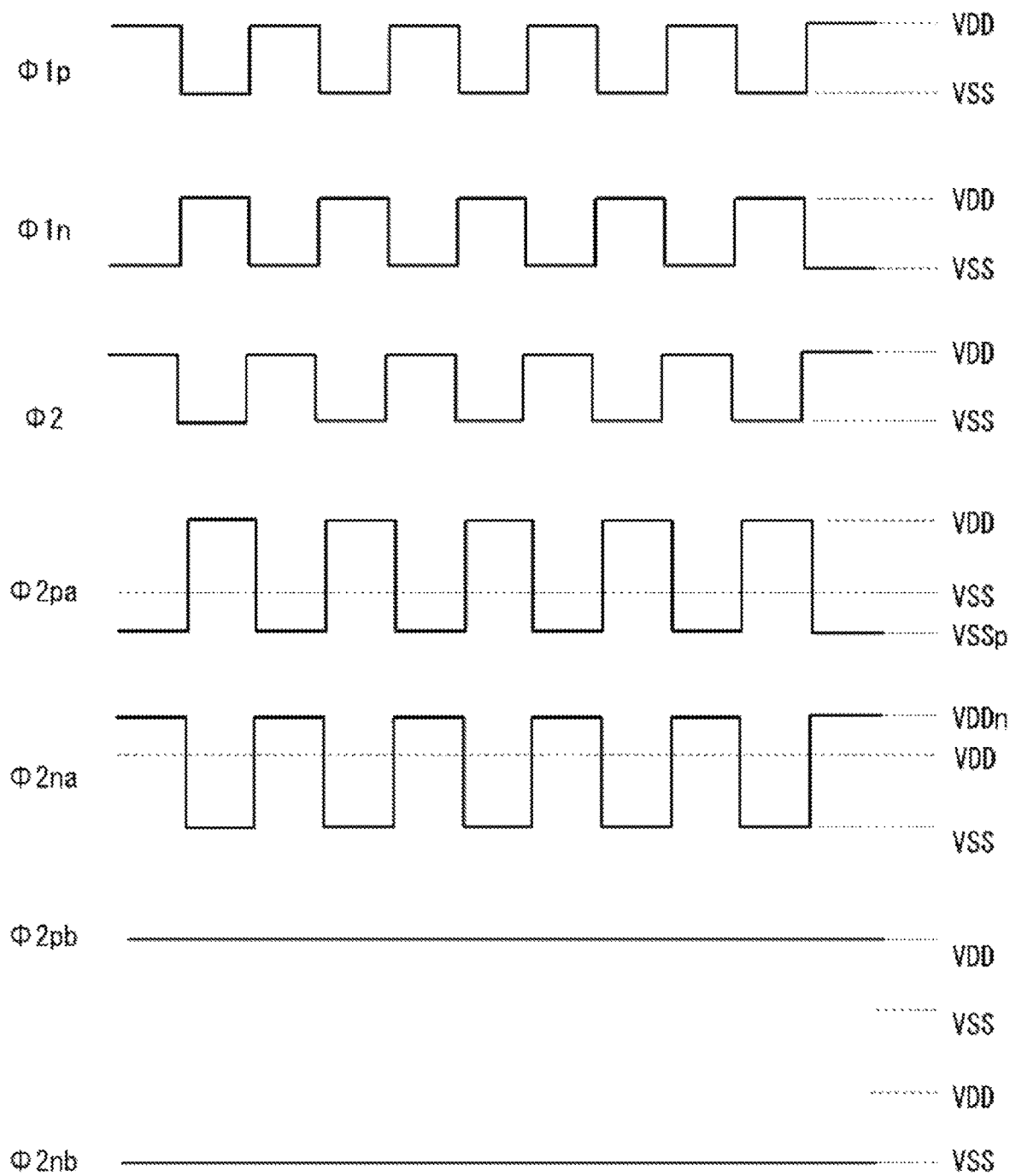
FIG. 16 shows transient waveforms of output voltages of the clock buffer when LVDET="1" in the embodiment 2.

The configuration of the DA conversion device 100 in the embodiment 2 is the same as that in the embodiment 1. The embodiment 2 differs from the embodiment 1 in that configurations of a DA converter 141 and a clock buffer 181 are different from those of the DA converter 140 and the clock buffer 180 of the embodiment 1. A configuration diagram of the DA converter 141 is shown in FIG. 13, a configuration diagram of the clock buffer 181 is shown in FIG. 14, and transient waveforms of inputs Φ2 and outputs of the clock buffer 181 are shown in FIGS. 15 and 16. In FIG. 13, each of switches SY1, SY2, . . . , SYi connected to the output signal Vout is divided into two switches (SYa1, SYa2, . . . , SYai and SYb1, SYb2, . . . , SYbi), Φ2pa is supplied to P-channel transistors of SYa1, SYa2, . . . , SYai, Φ2na is supplied to N-channel transistors thereof, Φ2pb is supplied to P-channel transistors of SYb1, SYb2, . . . , SYbi, and Φ2nb is supplied to N-channel transistors thereof. Φ2 is supplied to the switch SB. Although the circuit shown in FIG. 13 has a single-end configuration, a full differential configuration is also possible. As shown in FIG. 14, the clock buffer 181 of the embodiment 2 is a modification example of the clock buffer 180 of the embodiment 1 shown in FIG. 9. In the embodiment 2, the setting part may include a clock generation circuit 16, a clock buffer 17 and a clock buffer 181.

(Operation)

A procedure of generating the control signal LVDET is the same as that of the embodiment 1. In the configurations of FIGS. 13 and 14, since the voltage dropping circuit 26 and the voltage boosting circuit 27 are powered down and thus Φ2a becomes "0" as shown in FIG. 15 when the control signal LVDET is "0," Φ2pa and Φ2na become fixed values and switching of the transistor switches SYa1, SYa2, . . . , SYai is not performed. On the other hand, Φ2b is supplied to the clock buffer 181 which generates Φ2pb and Φ2nb and switching of the transistor switches SYb1, SYb2, . . . , SYbi is performed. Since SYb1, SYb2, . . . , SYbi which are switched are the same components as those of the related, power consumption and distortion are equivalent to those of the prior art.

When the control signal LVDET is "1," the power dropping circuit 26 and the power boosting circuit 27 are powered up. As shown in FIG. 16, Φ2a is supplied to the clock buffer 181 which generates Φ2pa and Φ2na and switching of the transistor switches SYa1, SYa2, . . . , SYai is performed. On the other hand, since Φ2b becomes "0," Φ2pb and Φ2nb become fixed values and switching of the transistor switches SYb1, SYb2, . . . , SYbi is not performed. Since the gate-source voltages of SYa1, SYa2 . . . SYai which are switched increase, signal dependency of resistance values of SYa1, SYa2, . . . , SYai is reduced and distortion characteristics decrease.

Figure 17:
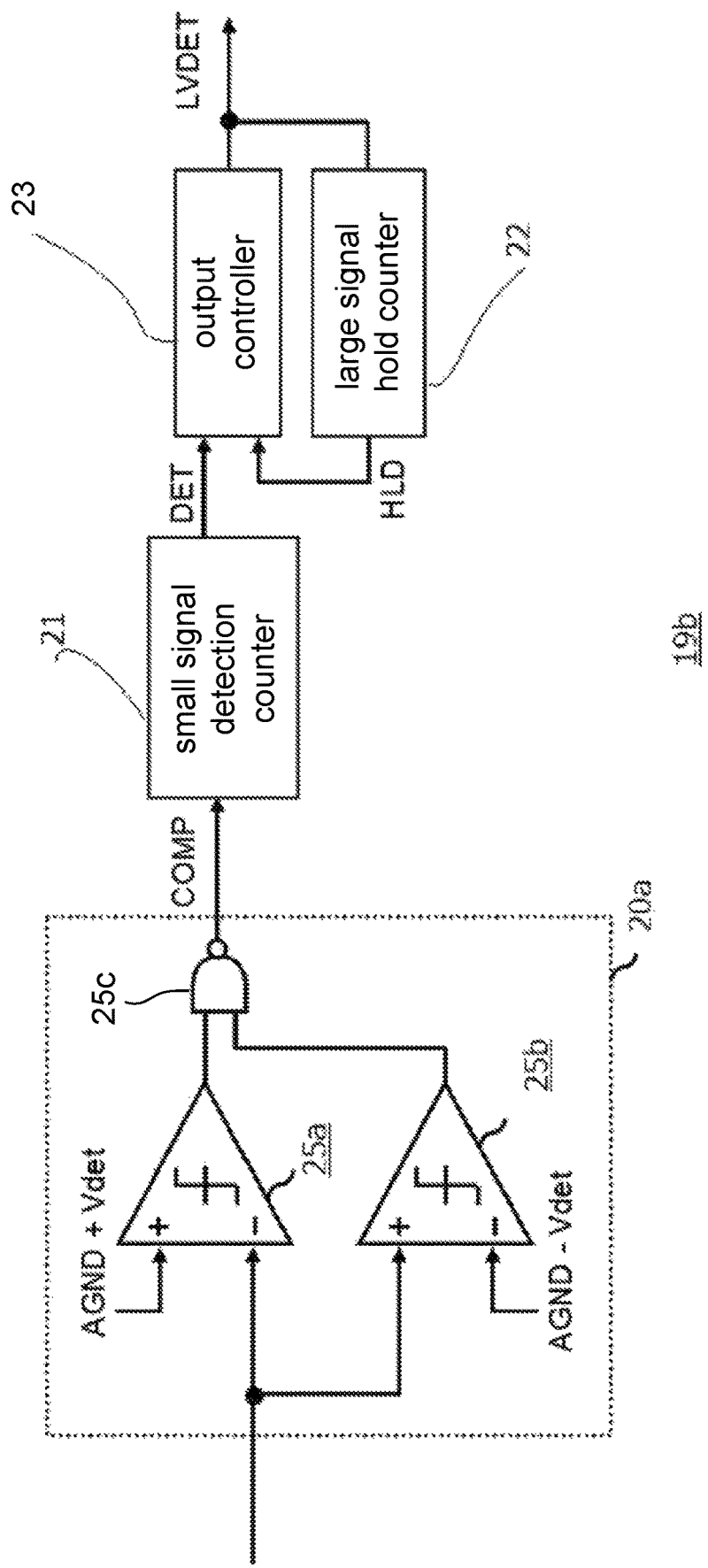
FIG. 17 shows a level determiner of another embodiment of the disclosure.

FIG. 17 is a diagram showing a configuration diagram of a level determiner of another embodiment. The level determiner 19b differs from the level determiner 19 of FIG. 6 with respect to a configuration of a level comparator 20a. The level comparator 20a includes a comparator 25a which compares an input signal with (the signal AGND+ threshold value Vdet), a comparator 25b which compares an input signal with (the signal AGND—threshold value Vdet), and a logic gate 25c. This level determiner 19b determines whether the level of an analog signal is higher than a predetermined threshold value. Here, the signal AGND (analog ground) is an analog reference voltage.

Figure 18:
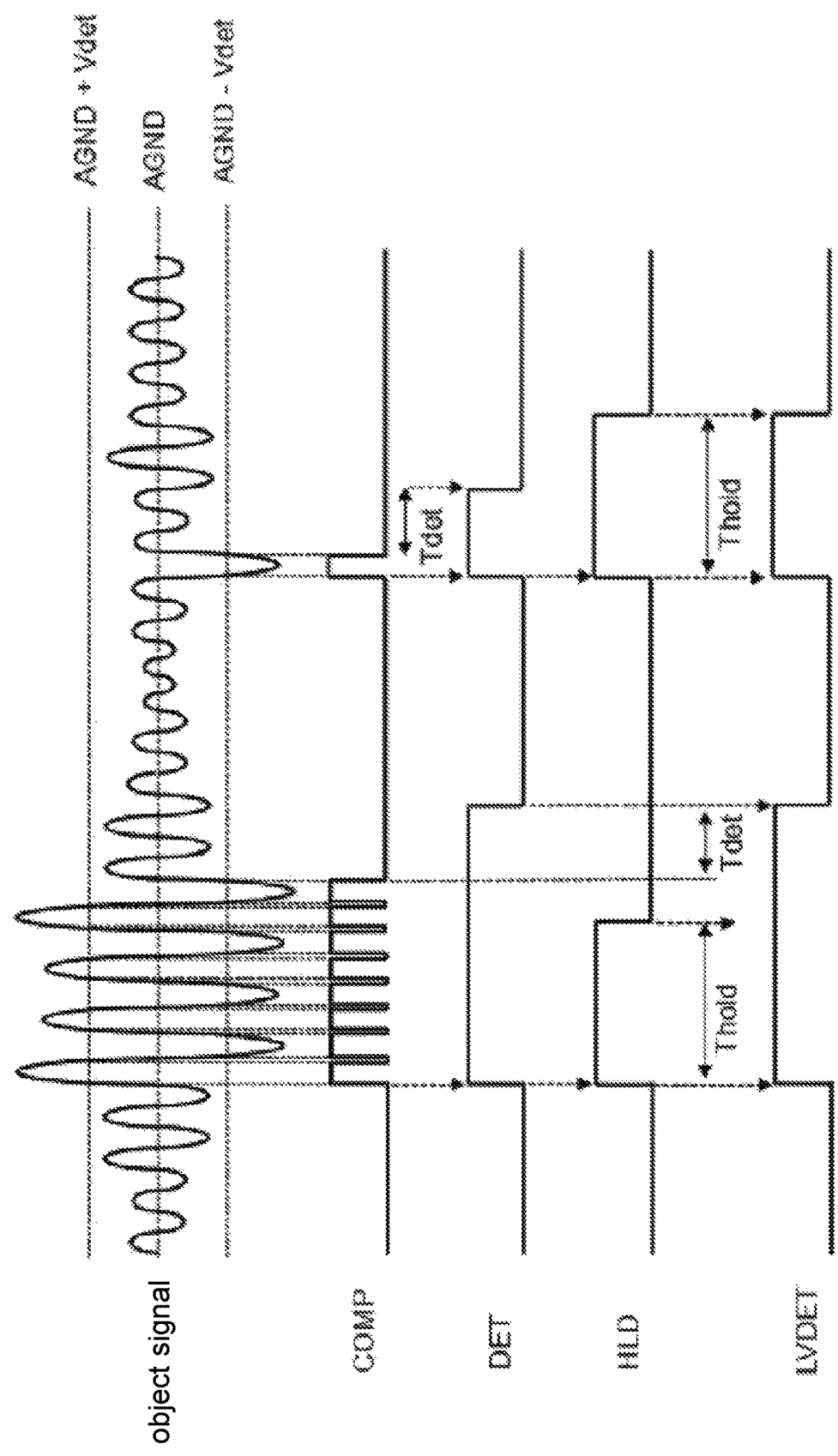
FIG. 18 shows transient waveforms under a condition in which a control signal and LVDET are generated from the level determiner in FIG. 17.

FIG. 18 is a diagram showing transient waveforms under a condition in which the control signal LVDET is generated from the level determiner 19b in FIG. 17. As shown in FIG. 18, the control signal LVDET is "0" when an object signal is less than the sum of the signal AGND and the predetermined threshold value Vdet or a difference between the signal AGND and the predetermined threshold value Vdet and is "1" when the object signal is equal to or higher than the sum of the signal AGND and the predetermined threshold value Vdet or the difference between the signal AGND and the predetermined threshold value Vdet. The signal COMP that is the output signal of the level comparator 20a becomes "1" in a state in which the control signal LVDET is "0." When the signal COMP becomes "1," the signal DET that is the output signal of the small signal detection counter 21 becomes "1." When the signal DET becomes "1," the output controller 23 causes the transition of the control signal LVDET from "0" to "1." When the transition of the control signal LVDET from "0" to "1" occurs, the large signal hold counter 22 starts counting and the signal HLD becomes "1." Since the control signal LVDET remains in the state of "1," the signal HLD becomes "0" after the large signal hold counter 22 performs counting up to the first reference time Thold. Here, when the signal COMP becomes "0" in a state in which the signal DET is "1," the small signal detection counter 21 starts counting, and when the state in which the signal COMP is "0" continues for the second reference time Tdet, the output controller 23 causes the transition of the control signal LVDET to "0." Further, when transition of the signal HLD from "1" to "0" has occurred in a state in which the signal DET is "0," the output controller 23 causes transition of the control signal LVDET from "1" to "0." The first reference time Thold and the second reference time Tdet are provided in order to suppress frequent switching of the control signal LVDET. Meanwhile, values of the predetermined threshold value Vdet, the first reference time Thold, and the second reference time Tdet are parameters that can be controlled from the outside of the device. The first reference time Thold is set to be longer than the second reference time Tdet.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A DA conversion device which converts a digital signal into an analog signal, comprising:
    a level determiner which determines whether a level of the digital signal or the analog signal is higher than a predetermined threshold value;
    a DA converter including a plurality of capacitors, an operational amplifier which generates the analog signal, and a plurality of transistors which connects each of the plurality of capacitors to a first reference voltage or a second reference voltage according to the digital signal in a first connection state and connects the plurality of capacitors between an input terminal and an output terminal of the operational amplifier in a second connection state; and
    a setting part which receives a clock signal, and sets gate-source voltages of the plurality of transistors such that the plurality of transistors is in the first connection state in a first period of the clock signal and the plurality of transistors is in the second connection state in a second period of the clock signal,
    wherein the setting part sets absolute values of the gate-source voltages of at least a portion of the plurality of transistors to be lower than absolute values of the gate-source voltages of a case in which the level determiner determines that the level is higher than the threshold value when the level determiner determines that the level is lower than the threshold value.

2. The DA conversion device according to claim 1, wherein the setting part sets the gate-source voltages of at least a portion of a plurality of N-channel transistors among the plurality of transistors to be low when the level determiner determines that the level is lower than the threshold value as compared to a case in which the level determiner determines that the level is higher than the threshold value.

3. The DA conversion device according to claim 2, wherein the setting part sets the gate-source voltages of at least a portion of a plurality of P-channel transistors among the plurality of transistors to be high when the level determiner determines that the level is lower than the threshold value as compared to a case in which the level determiner determines that the level is higher than the threshold value.

4. The DA conversion device according to claim 1, wherein the setting part sets the gate-source voltages of at least a portion of a plurality of P-channel transistors among the plurality of transistors to be high when the level determiner determines that the level is lower than the threshold value as compared to a case in which the level determiner determines that the level is higher than the threshold value.

5. The DA conversion device according to claim 1, wherein the level determiner determines whether a level of a signal having a correlation with an output signal of the DA converter is higher than the predetermined threshold value.

6. The DA conversion device according to claim 1, wherein the level determiner generates a first control signal which becomes a first logic value of the first period after the level is determined to be higher than the predetermined threshold value, and generates a second control signal which becomes a first logic value of the second period after the level is determined to be lower than the predetermined threshold value, and
    the setting part sets the absolute values of the gate-source voltages of at least the portion of the plurality of transistors to be low in a case that the second control signal is transient from the first logic value to the second logic value when the first control signal is the second logic value or in a case that the first control signal is transient from the first logic value to the second logic value when the second control signal is the second logic value, as compared to a case in which the level determiner determines that the level is higher than the predetermined threshold value.

* * * * *